United States Patent
Huang et al.

(10) Patent No.: US 8,877,594 B2
(45) Date of Patent: Nov. 4, 2014

(54) CMOS DEVICE FOR REDUCING RADIATION-INDUCED CHARGE COLLECTION AND METHOD FOR FABRICATING THE SAME

(75) Inventors: Ru Huang, Beijing (CN); Fei Tan, Beijing (CN); Xia An, Beijing (CN); Qianqian Huang, Beijing (CN); Dong Yang, Beijing (CN); Xing Zhang, Beijing (CN)

(73) Assignee: Peking University, Beijing (CN)

( * ) Notice: Subject to any disclaimer, the term of this patent is extended or adjusted under 35 U.S.C. 154(b) by 231 days.

(21) Appl. No.: 13/509,170

(22) PCT Filed: Nov. 30, 2011

(86) PCT No.: PCT/CN2011/083244
§ 371 (c)(1),
(2), (4) Date: May 10, 2012

(87) PCT Pub. No.: WO2013/071650
PCT Pub. Date: May 23, 2013

(65) Prior Publication Data
US 2013/0119445 A1    May 16, 2013

(30) Foreign Application Priority Data
Nov. 14, 2011    (CN) .......................... 2011 1 0359705

(51) Int. Cl.
*H01L 21/00*    (2006.01)
*H01L 29/10*    (2006.01)
*H01L 29/66*    (2006.01)
*H01L 29/78*    (2006.01)

(52) U.S. Cl.
CPC ........ *H01L 29/6653* (2013.01); *H01L 29/1083* (2013.01); *H01L 29/7833* (2013.01); *H01L 29/6659* (2013.01)
USPC .............................. 438/289; 438/396; 438/66

(58) Field of Classification Search
CPC .................. H01L 29/6659; H01L 21/823214; H01L 21/26586; H01L 29/6653; H01L 29/1083; H01L 29/7833
USPC .............................. 257/288, 190; 438/396, 66
See application file for complete search history.

(56) References Cited

U.S. PATENT DOCUMENTS

| 5,631,485 A | 5/1997 | Wei et al. |
| 7,250,332 B2 | 7/2007 | Lai et al. |

(Continued)

OTHER PUBLICATIONS

International Search Report dated Aug. 23, 2012 as received in application No. PCT/CN2011/083244.

(Continued)

*Primary Examiner* — Laura Menz
(74) *Attorney, Agent, or Firm* — Maschoff Brennan

(57) ABSTRACT

A CMOS device for reducing a radiation-induced charge collection and a method for fabricating the same. In the CMOS device, a heavily doped charge collection-suppressed region is disposed directly under the source region and the drain region. The region has a doping type opposite that of the source region and the drain region, and has a doping concentration not less than that of the source region and the drain region. The charge collection-suppressed region has a lateral part slightly less than or equal to that of the source region and the drain region, and has a lateral range toward to the channel not exceed the edges of the source region and the drain region. The CMOS device may greatly reduce a range of the funnel that appears under the action of a single particle, so that charges collected instantaneously under a force of an electric field may be reduced.

4 Claims, 3 Drawing Sheets

(56) References Cited

U.S. PATENT DOCUMENTS

| | | |
|---|---|---|
| 7,271,079 B2 | 9/2007 | Furukawa et al. |
| 2005/0093032 A1 | 5/2005 | Liu et al. |
| 2008/0277735 A1 | 11/2008 | Ko et al. |
| 2009/0039389 A1 | 2/2009 | Tseng et al. |
| 2013/0119445 A1* | 5/2013 | Huang et al. .................. 257/288 |

OTHER PUBLICATIONS

Written Opinion of the International Searching Authority dated Aug. 23, 2012 as received in application No. PCT/CN2011/083244.

* cited by examiner

US 8,877,594 B2

CMOS DEVICE FOR REDUCING RADIATION-INDUCED CHARGE COLLECTION AND METHOD FOR FABRICATING THE SAME

FIELD OF THE INVENTION

The present invention relates to a CMOS device, and in particular, to a CMOS device for reducing radiation-induced charge collection and a method for fabricating the same.

BACKGROUND OF THE INVENTION

With the development of sciences and technologies, more and more electronic systems are required to be applied in various radiation environments, for example, space radiation environment, nuclear radiation environment, simulated source environment and ground radiation environment. Various radiation effects may make an integrated circuit fail, and single event effect has become a main threat that causes a thin gate oxide device to fail. The single event effect refers to that when a highly energetic charged particle in a radiation environment passes a sensitive region of an integrated-circuit device, a large number of electron-hole pairs generated on the trace are collected under a force of an electric field of a semiconductor PN junction depletion layer, which causes a logic state of the device to change abnormally or causes the device to be damaged. Wherein, the charges collected may cause a transient current at a circuit node, and the phenomenon is referred to as single event transient. If the single event transient occurs in an output stage of a circuit, an error in the output may be caused; if the single event transient occurs in a storage cell, information stored in the storage cell may be caused to change; moreover, if occurs in a logic circuit, the single event transient may propagate along the logic circuit, and a propagation induced pulse broadening (PIPB) effect may appear during the propagation process, which aggravates a probability that the single particle causes an integrated circuit to fail. Since, as the integrated-circuit device works normally, a drain junction is usually reversely biased, the drain junction of the device is regarded as a sensitive node on which charges are collected due to the single event effect. Therefore, it is important to the research of radiation-hardened circuits that the number of charges collected on the sensitive node of the integrated-circuit device in a radiation environment is lowered.

FIG. 1 is a schematic diagram showing a process in which charged heavy ions pass through a sensitive node of a device. In the figure, reference sign "a" refers to a depletion region, reference sign "b" refers to a "funnel" region, reference sign "c" refers to electron-hole pairs generated along an ion trace, and reference sign "d" refers to the ion trace.

A basic process for forming single event transient in a radiation environment includes the following stages.

1) Charge Generation: Charged ions are injected into a semiconductor material, and because the ions have a very high energy, a large number of electron-hole pairs are generated along an ion trace.

2) Instantaneous Collection (also referred as Funnel Collection): the large number of electron-hole pairs generated make a depletion region of an original PN junction to locally collapse, and make the iso-electrostatic potential surface of the depletion region deformed to form a shape similar to a funnel. The electron-hole pairs in the funnel start to drift in different directions and are collected by the electrodes under the force of an electric field of the depletion region. The duration of such a process is usually tens of ps to hundreds of ps, and is called instantaneous collection.

3) Diffusion Collection: the electron-hole pairs outside the depletion region diffuse due to a concentration difference. If the electron-hole pairs diffuse into the PN junction which is reversely biased, the electron-hole pairs are again collected by the electrode under the force of the electric field of the depletion region. Because there is no force of an electric field, most of the electron-hole pairs are recombined, and the charges diffused or collected do not occupy a dominant position among the charges collected in the single event transient.

Since, during a normal working process of a planar CMOS device, the drain region and the substrate underneath are usually in a reversely biased state, the drain region of the device is usually a sensitive node in a radiation environment. Since the substrate is lightly doped relative to the drain region, a dimension of the funnel region generated in single event transient is very large, and a dimension of the funnel region is a key factor affecting the number of charges collected by the sensitive node.

SUMMARY OF THE INVENTION

To overcome the problems of the prior art, an embodiment of the present invention provides a device for reducing charges collected during single-event-transient process in a radiation environment.

An object of an embodiment of the present invention is to provide a CMOS device for reducing the radiation-induced charge collection.

The CMOS device according to the embodiment of the present invention includes a substrate, a device isolation region, a gate region, a source region, a drain region and an lightly doped drain (LDD) region, wherein, a heavily doped charge collection-suppressed region is disposed directly under the source region and the drain region, and the doping type of this region is opposite to that of the source region and the drain region.

The doping concentration of the heavily doped charge collection-suppressed region is equal to or not less than that of the source region and the drain region.

The lateral range of the charge collection-suppressed region is slightly less than or equal to that of the source region and the drain region, and the lateral position toward to the channel does not exceed the edges of the source region and the drain region.

Another object of an embodiment of the present invention is to provide a method for fabricating a CMOS device for reducing a radiation-induced charge collection.

The method for fabricating a CMOS device to reduce radiation-induced charge collection according to the embodiment of the invention includes the following steps:

1) providing a semiconductor substrate;

2) thermally growing a silicon dioxide layer over the substrate as a buffer layer, depositing a silicon nitride layer, defining a field region through photolithography technology, etching the silicon nitride layer through reactive ion etching, performing implantation for the field region, depositing a silicon dioxide layer and a barrier layer, and planarizing a resultant surface by chemical-mechanical polishing (CMP) to form a device isolation region;

3) after cleaning, growing a gate dielectric layer such as a silicon dioxide layer or a high-K material layer, and depositing a gate electrode layer such as a polysilicon layer or a metal layer, defining a gate pattern by photolithography technology, etching the gate electrode and the gate dielectric material outside the pattern to form a gate region, performing LDD region implantation and forming a LDD region;

4) depositing a silicon dioxide layer or a silicon nitride layer, and performing an anisotropic etching to the silicon dioxide layer or silicon nitride layer to form a gate sidewall;

5) depositing a silicon dioxide layer or a silicon nitride layer to form a barrier layer, and performing an anisotropic etching to the silicon dioxide layer or the silicon nitride layer to form a barrier layer sidewall;

6) performing a heavily-doped ion implantation to form a charge collection-suppressed region;

7) etching the barrier layer sidewall, performing implantation for a source region and a drain region, wherein the source region and the drain region have implantation depths less than that of the heavily doped charge collection-suppressed region and have doping types opposite to that of the charge collection-suppressed region, and activating impurities by rapid annealing technology to form the source region and the drain region.

The invention has the following advantages.

By adding a heavily-doped region with a doping concentration close to that of a drain region under the drain region, a range of the funnel region that appears under a strike of a single particle may be greatly reduced, so that charges collected instantaneously under a force of an electric field may be reduced. Because a width of a depletion layer becomes narrow, it is more difficult for an electron-hole pair in the range of the funnel to spread to edges of the depletion layer, therefore the charges collected by a sensitive node may be greatly reduced, and influence of single event transient on the integrated circuit may be effectively suppressed. Considering that the source region and the drain region of a CMOS device may be exchanged, the heavily-doped region may exist under the source region and the drain region of the CMOS device at the same time. In order to avoid that the channel is floated due to the existence of heavily-doped regions of the source region and the drain region, a lateral range of the heavily-doped region toward the channel is slightly less than or equal to the range of the source region and the drain region.

A heavily-doped region, named a charge collection-suppressed region, is added directly under a source region and a drain region of a traditional CMOS device. The doping type of this region is opposite to that of a sensitive node, and the doping concentration of this region is no less than that of the source region and the drain region. During a technological process for realizing the above, in order to ensure that the charge collection-suppressed region lies directly under the source region and the drain region of the CMOS device, it is needed to control the implantation depth of the charge collection-suppressed region to be larger than that of the source region and the drain region. To make the charge collection-suppressed region directly under the source region and the drain region and to avoid that an edge of the charge collection-suppressed region exceeds the source region and the drain region due to the problem of lateral spread of impurities which occurs when impurities are activated by annealing, a barrier layer is grown after a gate sidewall is formed, implantation of the charge collection-suppressed region is performed, and then implantation of the source region and the drain region is performed after the barrier layer is etched, so that the impurity implantation depth of the source region and drain region are formed less than that of the charge collection-suppressed region. At this time, the lateral part of the source region and the drain region toward to the channel are larger than the lateral part of the charge collection-suppressed region. By controlling the temperature and time of annealing, the lateral distance of the charge collection-suppressed region spreading toward the channel is made slightly less than or equal to the lateral distance of the impurity of the source region and the drain region spreading toward the channel, that is, the charge collection-suppressed region lies directly under the source region and the drain region, and the lateral position toward to the channel does not exceed the edges of the source region and the drain region.

DETAILED DESCRIPTION OF THE EMBODIMENTS

An implementation of the present invention is illustrated in detail below in conjunction with the drawings.

Figure 1:
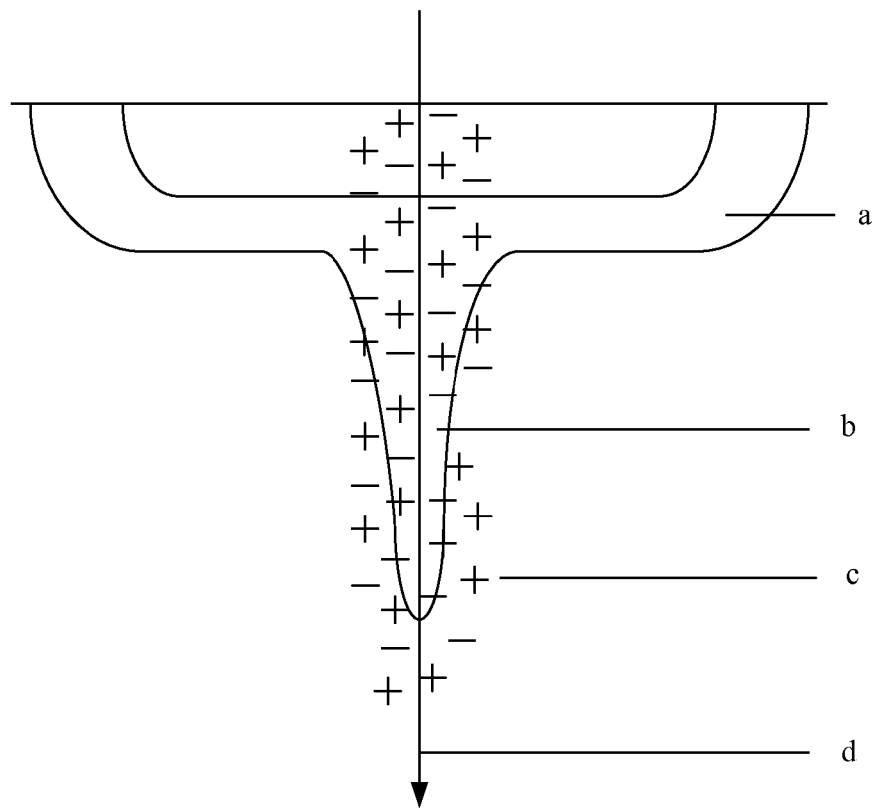
FIG. 1 is a schematic diagram showing a process in which charged heavy ions pass through a sensitive node of a device.
Figure 2:
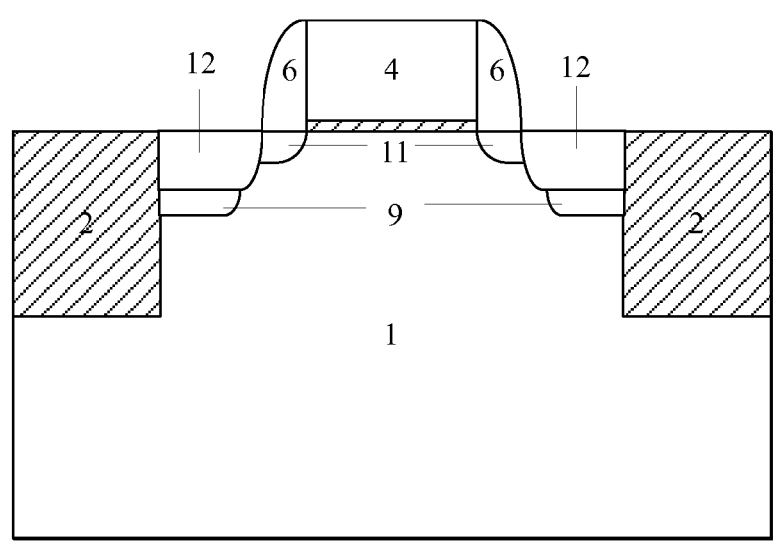
FIG. 2 is a sectional view of a CMOS device according to an embodiment of the present invention.

FIG. 2 is a sectional view of a CMOS device according to an embodiment of the present invention. As shown in the figure, the CMOS device according to the embodiment includes a substrate 1, a device isolation region 2, a gate region 4, a gate sidewall 6, a source region 12 and a drain region 12 and an LDD region 11, wherein a charge collection-suppressed region 9 is added directly under the source region and the drain region.

A specific implementation of the present invention is illustrated below by taking an NMOS as an example.

1) Preparation of the substrate: a lightly-doped P-type silicon with a crystal orientation of direction (100) is employed as the substrate 1, and has a doping concentration of $10^{15}$-$10^{16}$ cm$^{-3}$.

Figure 3:
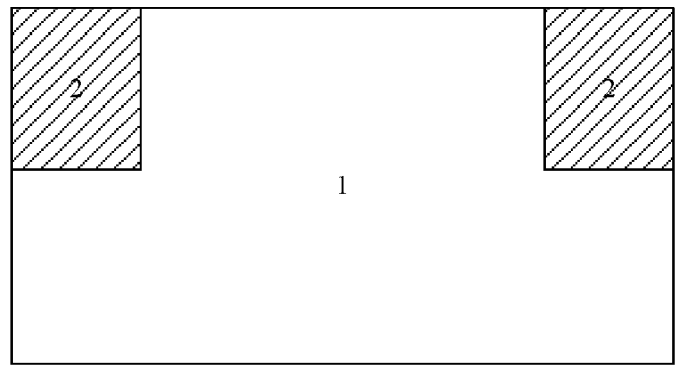
FIG. 3 (a) to FIG. 3 (f) are sectional views showing a process flow of a method for fabricating a CMOS device according to an embodiment of the present invention.
Figure 3:
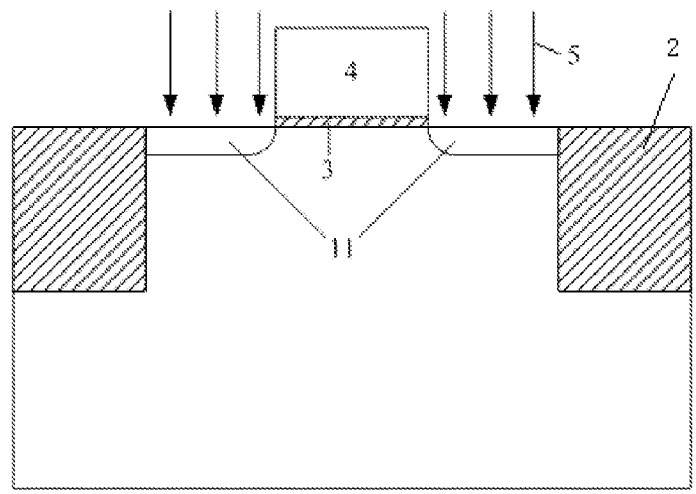
Figure 3:
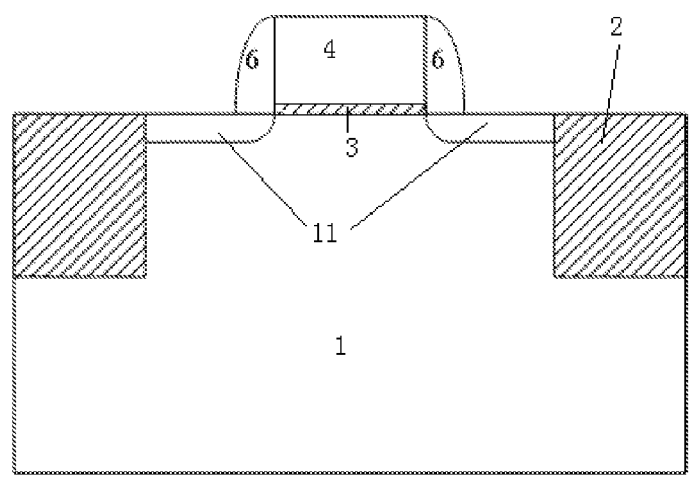
Figure 3:
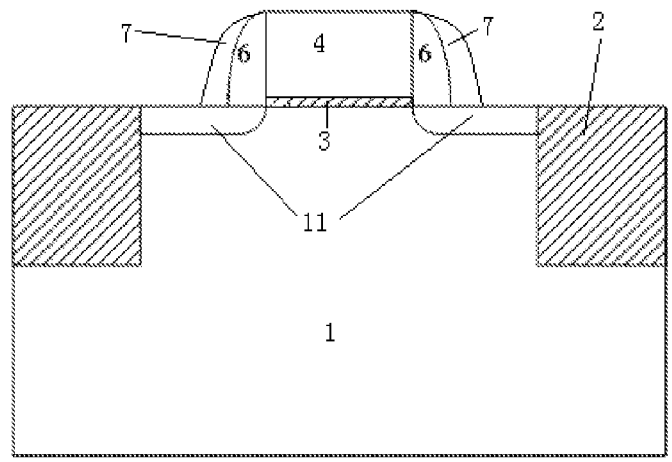
Figure 3:
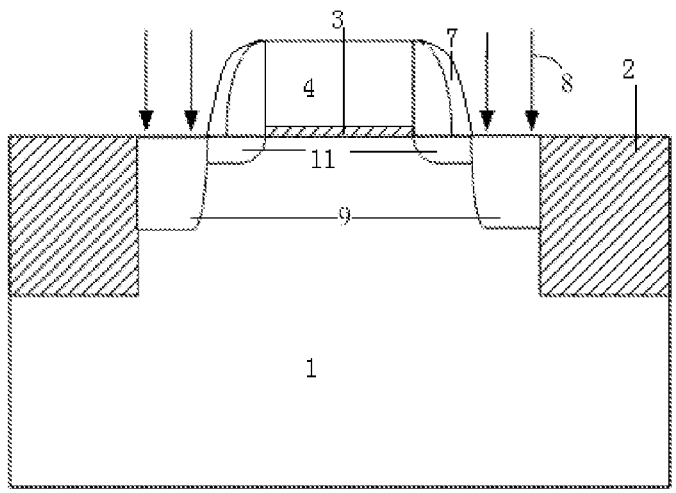
Figure 3:
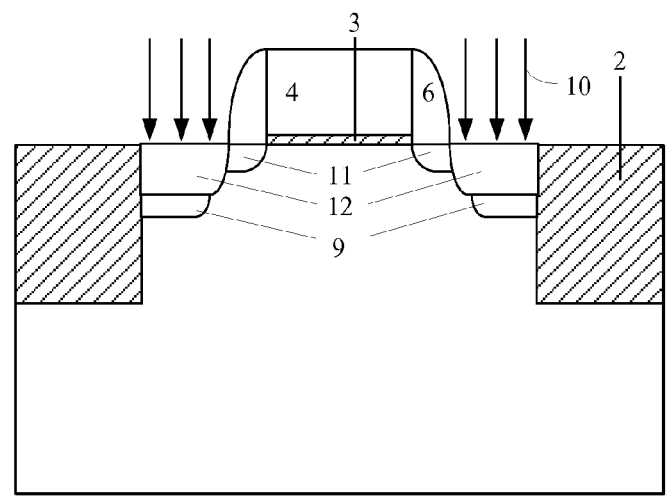

2) Forming of the device Isolation region: a silicon dioxide layer is thermally grown on the substrate 1 as a buffer layer, a silicon nitride layer is deposited and a region of an isolation region is defined by a photolithography technology, the silicon nitride layer is etched by the reactive ion etching, and an implantation is performed for the isolation region , a silicon dioxide layer and a barrier layer are deposited, the resultant surface is planarized by chemical-mechanical polishing (CMP) and the device isolation region 2 is formed, as shown in FIG.3 (a).

3) Forming of the gate region and the LDD region: cleaning is performed and after the cleaning, a gate oxide layer 3 is grown, a polysilicon is deposited as a gate electrode 4, a gate pattern is defined by a photolithography technology, the gate electrode and the gate dielectric material outside the pattern are etched to form the gate region of the MOSFET, an impurity implantation 5 is performed for LDD-region by using phosphorus, wherein the implantation concentration is $10^{18}$cm$^{-3}$, and the LDD region 11 is formed, as shown in FIG.3 (b).

4) Forming of the gate sidewall: a silicon dioxide layer is deposited, and the silicon dioxide layer is anisotropically etched to form the gate sidewall 6, as shown in FIG. 3 (c).

5) Forming of the p-type heavily-doped region: a silicon nitride layer is deposited, and is anisotropically etched to form the barrier layer sidewall 7, as shown in FIG. 3 (d).

6) Forming of the charge collection-suppressed region: an implantation 8 for p-type heavily-doped region is performed by using boron, and the charge collection-suppressed region

9 of the P-type heavily-doped region is formed, wherein the doping concentration of the heavily-doped region is $10^{19}$ cm$^{-3}$, as shown in FIG. 3 (e).

7) Forming of the source region and the drain region: the barrier layer sidewall 7 is etched, an implantation 10 is performed for the source region and the drain region by using phosphorus, wherein the implantation concentration is $10^{19}$ cm$^{-3}$ and the implantation depth is less than that of the charge collection-suppressed region of the P-type heavily-doped region, and the source region 12 and the drain region 12 are formed by activating impurities by the rapid annealing technology, as shown in FIG. 3 (f).

The above embodiments described are not intended to limit the invention, and various variations and modifications will readily occur to those skilled in the art without departing from the spirit or scope of the invention. Therefore, the protection scope of the invention is as defined by the appended claims.

What is claimed is:

1. A method for fabricating a CMOS device for reducing a radiation-induced charge collection, comprising:
   1) providing a semiconductor substrate;
   2) thermally growing a silicon dioxide layer on the substrate as a buffer layer and depositing a silicon nitride layer; defining a field region by photolithography technology and etching the silicon nitride layer by reactive ion etching; performing an implantation for the field region; depositing a silicon dioxide layer and a barrier layer and planarizing a resultant surface by chemical-mechanical polishing to form a device isolation region;
   3) performing a cleaning; after the cleaning, growing a gate dielectric layer and depositing a gate electrode layer; defining a gate pattern by photolithography technology, etching the gate electrode layer and the gate dielectric layer outside the pattern to form a gate region; and performing an implantation for a LDD region to form the LDD region;
   4) depositing a silicon oxide layer or a silicon nitride layer and anisotropically etching the silicon oxide layer or the silicon nitride layer to form a gate sidewall;
   5) depositing a barrier layer and anisotropically etching the barrier layer to form a barrier layer sidewall;
   6) performing a heavily-doped ion implantation to form a charge collection-suppressed region;
   7) etching the barrier layer sidewall, performing implantation for a source region and a drain region with impurities, wherein the source region and the drain region have implantation depths less than that of the heavily doped charge collection-suppressed region and have doping types opposite to that of the charge collection-suppressed region, and activating the impurities by rapid annealing technology to form the source region and the drain region.

2. The method according to claim 1, wherein the gate dielectric layer in the step 3) is silicon dioxide or a high-K material.

3. The method according to claim 1, wherein the gate electrode layer in the step 3) is polysilicon or a metal.

4. The method according to claim 1, wherein the barrier layer in the step 5) is silicon dioxide or silicon nitride.

* * * * *